United States Patent
Chiu et al.

(10) Patent No.: US 9,685,226 B2
(45) Date of Patent: *Jun. 20, 2017

(54) TRACKING SIGNALS IN MEMORY WRITE OR READ OPERATION

(71) Applicant: TAIWAN SEMICONDUCTOR MANUFACTURING COMPANY, LTD., Hsinchu (TW)

(72) Inventors: Chih-Chieh Chiu, Hsinchu (TW); Hong-Chen Cheng, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/822,391

(22) Filed: Aug. 10, 2015

(65) Prior Publication Data

US 2015/0348616 A1    Dec. 3, 2015

Related U.S. Application Data

(63) Continuation of application No. 13/776,040, filed on Feb. 25, 2013, now Pat. No. 9,105,328.

(60) Provisional application No. 61/677,687, filed on Jul. 31, 2012.

(51) Int. Cl.
| | |
|---|---|
| G11C 7/00 | (2006.01) |
| G11C 11/419 | (2006.01) |
| G11C 7/22 | (2006.01) |
| G11C 7/08 | (2006.01) |
| G11C 11/4076 | (2006.01) |
| G11C 11/4099 | (2006.01) |

(52) U.S. Cl.
CPC ............ *G11C 11/419* (2013.01); *G11C 7/08* (2013.01); *G11C 7/227* (2013.01); *G11C 11/4076* (2013.01); *G11C 11/4099* (2013.01)

(58) Field of Classification Search
CPC ......... G11C 11/419; G11C 7/227; G11C 7/08; G11C 11/4076; G11C 11/4099
USPC ........................................ 365/194, 193, 196
See application file for complete search history.

(56) References Cited

U.S. PATENT DOCUMENTS

| | | | | |
|---|---|---|---|---|
| 5,715,201 | A * | 2/1998 | Khieu | G11C 7/22 365/189.02 |
| 6,072,732 | A | 6/2000 | McClure | |
| 6,252,814 | B1 | 6/2001 | Tran et al. | |
| 6,731,534 | B1 | 5/2004 | Fan | |
| 6,965,520 | B1 | 11/2005 | Seshadri et al. | |
| 7,012,839 | B1 | 3/2006 | Chu et al. | |
| 7,142,466 | B1 * | 11/2006 | Muthalif | G11C 7/08 365/191 |
| 7,359,281 | B2 | 4/2008 | Soares et al. | |
| 7,483,327 | B2 | 1/2009 | Qureshi et al. | |

(Continued)

*Primary Examiner* — Viet Q Nguyen
(74) *Attorney, Agent, or Firm* — Hauptman Ham, LLP (57) ABSTRACT

A signal generating circuit includes a first circuit, a tracking circuit, and a delay circuit. The delay circuit is coupled with the first circuit and the tracking circuit. The first circuit is configured to receive a first clock signal and an output signal from an output of the delay circuit, and to generate a second clock signal and at least one first tracking signal. The tracking circuit is configured to receive the at least one first tracking signal and to generate a second tracking signal. The delay circuit is configured to receive the second clock signal and the second tracking signal and to generate the output signal.

20 Claims, 6 Drawing Sheets

(56) References Cited

U.S. PATENT DOCUMENTS

| | | | |
|---|---|---|---|
| 7,646,658 B2 | 1/2010 | Chen et al. | |
| 7,733,686 B2 | 6/2010 | Clinton | |
| 7,859,920 B2 | 12/2010 | Jung et al. | |
| 7,881,147 B2 | 2/2011 | Chen et al. | |
| 8,233,337 B2* | 7/2012 | Arsovski | G11C 7/04 365/154 |
| 8,315,085 B1 | 11/2012 | Chang et al. | |
| 8,320,210 B2 | 11/2012 | Narayanaswamy et al. | |
| 8,570,789 B2* | 10/2013 | Chang | G11C 11/413 365/138 |
| 8,619,477 B2* | 12/2013 | Wang | G11C 11/413 365/154 |
| 8,687,437 B2 | 4/2014 | Kim et al. | |
| 8,767,494 B2 | 7/2014 | Yang et al. | |
| 8,780,652 B2 | 7/2014 | Wang et al. | |
| 8,830,771 B2 | 9/2014 | Sharad et al. | |
| 8,830,783 B2 | 9/2014 | Idgunji et al. | |
| 8,913,440 B2* | 12/2014 | Tao | G11C 11/419 365/185.11 |
| 8,942,049 B2* | 1/2015 | Sridhara | G11C 7/08 365/154 |
| 9,093,126 B2* | 7/2015 | Yang | G11C 11/413 |
| 9,105,328 B2* | 8/2015 | Chiu | G11C 7/227 |
| 2013/0194860 A1* | 8/2013 | Cheng | G11C 11/419 365/154 |
| 2013/0322190 A1 | 12/2013 | Vikash et al. | |
| 2013/0322193 A1 | 12/2013 | Sahu et al. | |
| 2014/0032871 A1 | 1/2014 | Hsu et al. | |

* cited by examiner

TRACKING SIGNALS IN MEMORY WRITE OR READ OPERATION

PRIORITY CLAIM

The present application is a continuation of U.S. application Ser. No. 13/776,040, filed Feb. 25, 2013, now U.S. Pat. No. 9,105,328, issued Aug. 11, 2015, which claims priority of U.S. Provisional Application No. 61/677,687, filed Jul. 31, 2012, which are incorporated herein by reference in their entireties.

FIELD

The present disclosure is related to tracking signals in a memory write or read operations.

BACKGROUND

In memory operations, such as in static random access memory (SRAM) operations, read and write signal margins decrease as operational supply voltage VDD decreases. As technology advances, operational supply voltage VDD continues to decrease. As a result, speed performance has been sacrificed with VDD decreasing.

Transistors manufactured by a logic process are called logic transistors while transistors manufactured by a memory process are called memory transistors. In some approaches, both logic transistors and memory transistors are used in an SRAM macro. Both the logic process and the memory process result in slow, average, and fast transistors. For illustration, the condition in which a process provides slow, average, and fast transistors is called a slow condition or corner, an average corner, and a fast corner, respectively. In some approaches, speed performance of the SRAM macro is worst in a fast logic corner and a slow memory corner. To improve speed performance in average logic and memory corners, additional signal margins are added, which also compromises speed performance.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have at least one of the following features and/or advantages. In some embodiments, a parallel tracking mechanism includes both logic and memory transistors. Read and write margins are stable and sufficient for different predetermined manufacturing process, operational voltage, and temperature (PVT) corners, including a low operational voltage VDD corner such as about 60% of a normal operational voltage VDD. In some embodiments, a normal operational voltage VDD ranges from about 0.9 V to about 1.1 V. Delay elements used in tracking mechanisms are programmable.

Compared with other approaches, in various embodiments, margins of write and read signals are improved. In some embodiments, write signal margins are almost constant in different PVT corners, and improve up to about 33% compared with another approach. In some embodiments, in a fast logic and a slow memory corner, a write signal margin guard band of about 5% to 35% is achieved.

For illustration, in this document, "rise" refers to transitioning from a low to a high logical value, and "fall" refers to transitioning from a high to a low logical value.

Exemplary Circuits

Figure 1:
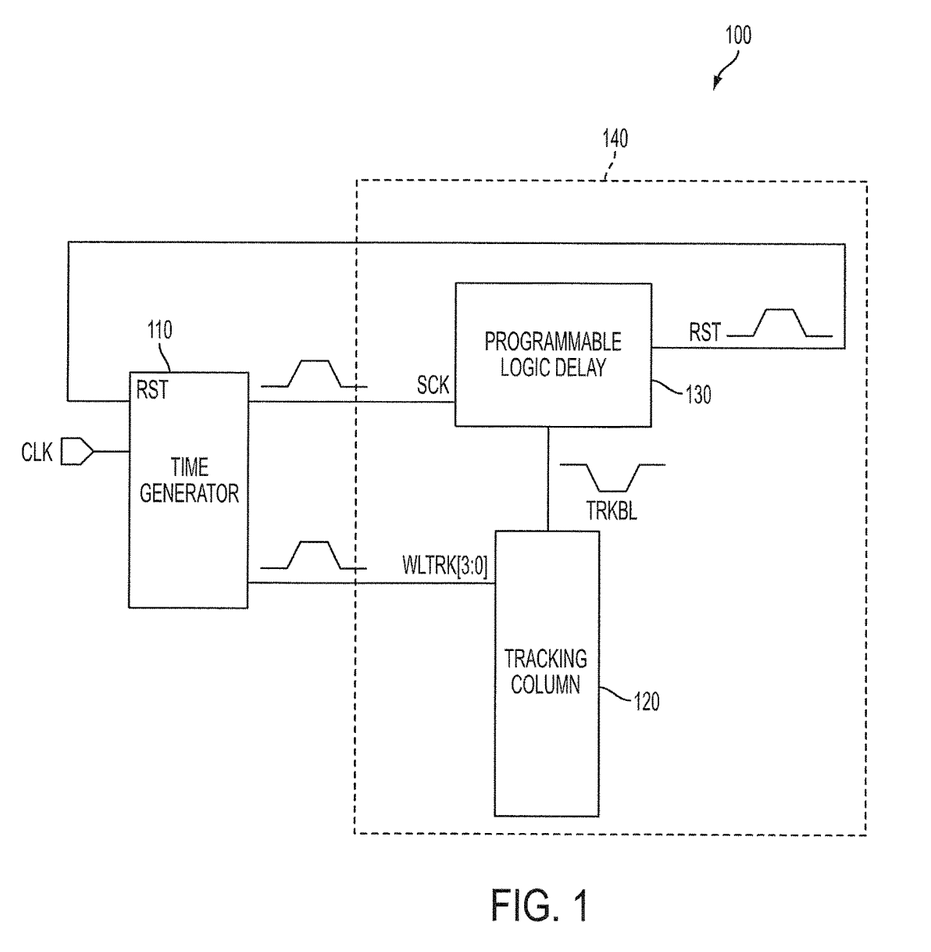
FIG. 1 is a diagram of a circuit used to generate a reset signal, in accordance with some embodiments.

FIG. 1 is a diagram of a circuit 100, in accordance with some embodiments. Circuit 100 generates a reset signal RST which causes deactivation of write signals. For example, in some embodiments, in a write cycle, a write word line signal is activated so that data is begun to be written to corresponding memory cells. If a pulse width of the write word signal is too small, writing ends prematurely, and the data is not successfully written to the memory cells. In other words, if the write word line signal is deactivated too early, the data is not written to the memory cells. Signal RST is generated such that the write word line signal is deactivated after the data is successfully written to the memory cells. Stated differently, signal RST is generated such that pulse width of the write word line signal is sufficiently large such that the data is successfully written to the memory cells.

Circuit 100 includes a time generator 110, a tracking column 120, and a programmable logic delay 130.

Time generator 110 receives a clock signal CLK and signal RST as a feedback signal, and generates a clock signal SCK and four tracking word line signals WLTRK[3:0]. Time generator 110 generates a rising of clock signal SCK at a rising edge of clock signal CLK, and generates a falling edge of clock signal SCK at a rising of signal RST. Effectively, clock signal SCK falls to a low logical value at a rising edge of signal RST. In some embodiments, after the rising edge of signal RST, writing to a memory cell has completed, and clock signal SCK falls to a low logical value until clock signal CLK rises again.

Time generator 110 generates tracking word line signals WLTRK[3:0] in a manner similar to generating signal RST. For example, time generator 110 generates a rising edge of each of tracking word line signals WLTRK[3:0] at a rising edge of clock signal CLK, and generates a falling edge of each of tracking word line signals WLTRK[3:0] at a rising edge of signal RST. In other words, tracking word line signals WLTRK[3:0] are deactivated after signal RST rises.

In some embodiments, when signal RST rises, writing to a memory cell has completed. Tracking word line signals WLTRK[3:0] are deactivated until clock signal CLK rises again. Because time generator 110 automatically deactivates clock signal SCK and tracking write word lines WLTRK, time generator 110 is also called a self-time generator.

Tracking column or tracking circuit 120 generates a tracking bit line signal TRKBL based on tracking word line signals WLTRK[3:0]. For simplicity, a tracking word line signal of tracking word line signals WLTRK[3:0] is called a tracking word line signal WLTRK. In some embodiments, in a write cycle, tracking bit line signal TRKBL is pre-charged to a high logical value. Pre-charge refers to charging before writing to or reading from a memory cell. Further, tracking column 120 includes a plurality of tracking cells each of which, in turn, includes a pull down device, such as an NMOS transistor illustrated in FIG. 2. When a tracking word line signal of tracking word line signals WLTRK[3:0] rises, the corresponding pull down device pulls tracking bit line signal TRKBL to a low logical value. Alternatively expressed, tracking column 120 generates a falling edge of tracking bit line signal TRKBL at a rising edge of at least one tracking word line signal of tracking word line signals WLTRK[3:0]. In contrast, when a tracking word line signal of tracking word line signals WLTRK[3:0] falls, tracking bit line signal TRKBL is pre-charged to a high logical value. In other words, tracking column 120 generates a rising edge of tracking bit line signal TRKBL at a falling edge of a tracking word line signal of tracking word line signals WLTRK[3:0].

Programmable logic delay or programmable delay 130 receives clock signal SCK and tracking bit line signal TRKBL, and generates signal RST. Programmable logic delay 130 generates a rising edge of signal RST in response to a rising edge of clock SCK plus a predetermined delay, and generates a falling edge of signal RST at a falling edge of tracking bit line signal TRKBL.

Different embodiments of a circuit 140 that includes tracking column 120 and programmable logic delay 130 are explained with reference to FIGS. 2 and 3.

Circuit 140, Some Embodiments

Figure 2:
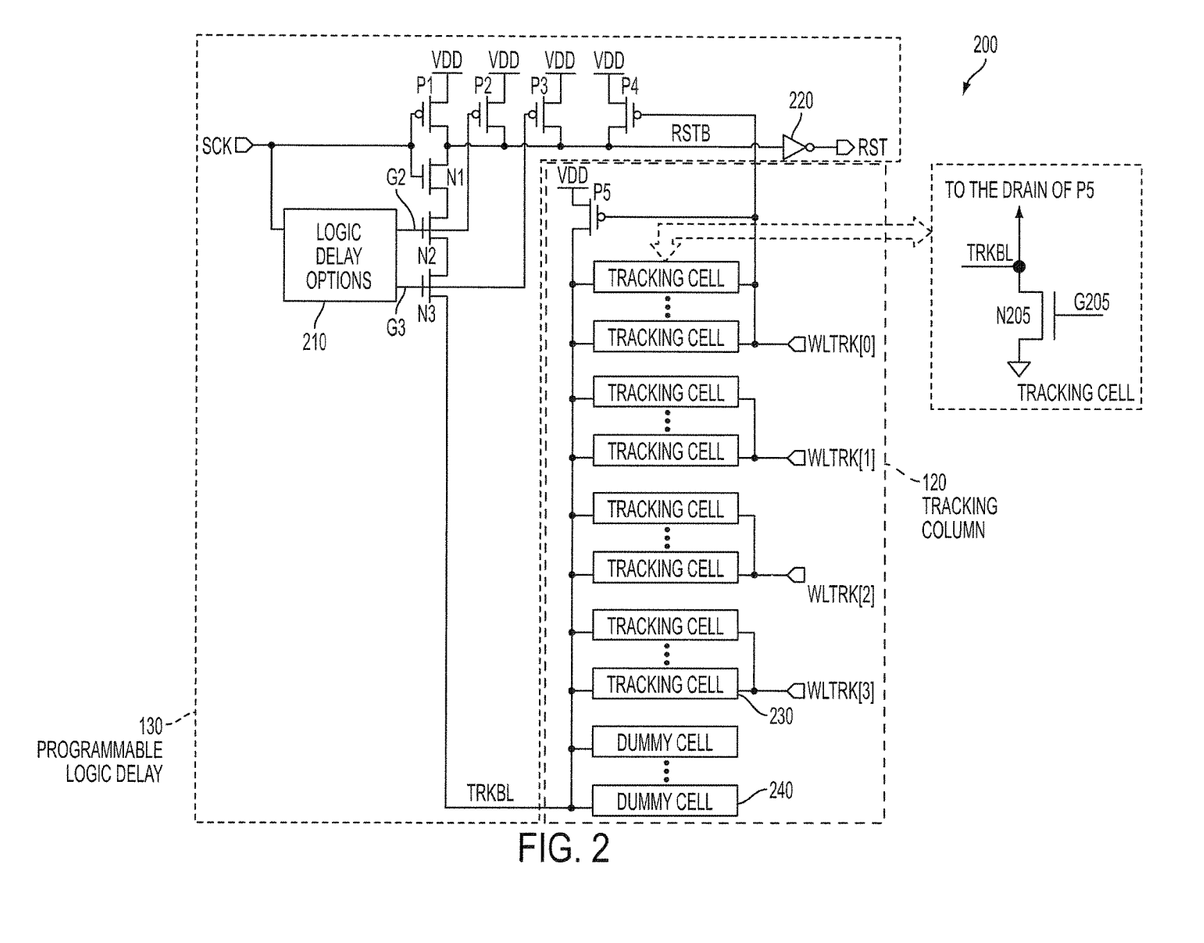
FIG. 2 is a diagram of a sub circuit of the circuit in FIG. 1, in accordance with some embodiments.

FIG. 2 is a diagram of a circuit 200, in accordance with some embodiments. Circuit 200 is an embodiment of circuit 140 in FIG. 1. In FIG. 2, tracking column 120 includes a PMOS transistor P5, a plurality of tracking cells 230 and a plurality of dummy cells 240. To avoid obscuring the drawing, one tracking cell 230 is labeled, and one dummy cell 240 is labeled. The number of tracking cells 230 and dummy cells 240 are selected to simulate a worst case condition in a write operation. In other words, the number of tracking cells 230 and dummy cells 240 are selected so that signal RST and write signals are generated to cover the worst case condition in a write operation.

Each tracking cell 230 includes a pull down device to pull signal TRKBL to a low logical value. In some embodiments, the pull down device is an NMOS transistor and is labeled N205. In each tracking cell 230, a drain of transistor N205 is coupled with a drain of PMOS transistor P5. A source of transistor N205 receives a reference voltage, which, in some embodiments, is ground, and a gate of transistor N205 receives a control signal G205 based on a corresponding tracking word line signal WLTRK. For example, when a corresponding tracking word line signal WLTRK is activated, control signal G205 is also activated to turn on transistor N205. As a result, tracking bit line signal TRKBL is pulled to ground or a low logical value at the source of transistor N205.

Each of tracking word line signal WLTRK[0], WLTRK[1], WLTRK[2], and WLTRK[3] of tracking word lines WLTRK[3:0] is used to control a plurality of tracking cells. In some embodiments, when a tracking word line signal WLTRK is activated with a high logical value, pull down NMOS transistors N205 in corresponding tracking cells 230 pull tracking bit line signal TRKBL to a low logical value.

Tracking word line signal WLTRK[0], in addition to being used to control the plurality of tracking cells 230, is also used to control PMOS transistor P4 of programmable logic delay 130 and PMOS transistor P5 of tracking column 120. For example, when tracking word line signal WLTRK[0] is activated with a high logical value, transistor P4 is turned off. A signal RSTB at drains of transistors P1, P2, P3, P4, and N2 is electrically affected by transistors P1, P2, P3, N1, N2, and N3. In contrast, when tracking word line WLTRK[0] is deactivated with a low logical value, transistor P4 is turned on and pulls signal RSTB at the drain of transistor P4 to operational voltage VDD at the source of transistor P4. As a result, by operation of inverter 220, signal RST is logically low.

Similarly, when tracking word line WLTRK[0] is activated with a high logical value, PMOS transistor P5 is turned off, and tracking bit line signal TRKBL is electrically affected by transistors P1, P2, P3, N1, N2, and N3, tracking cells 230, and dummy cells 240. In contrast, when tracking word line signal WLTRK[0] is deactivated with a low logical value, PMOS transistor P5 is turned on to pull tracking bit line signal TRKBL at the drain of PMOS transistor P5 to operational voltage VDD at the source of PMOS transistor P5. In some embodiments, pulling tracking bit line signal TRKBL to operational voltage VDD pre-charges tracking bit line signal TRKBL. In some embodiments, when tracking bit line signal TRKBL is pre-charged, tracking word line signals WLTRK[3:0] are deactivated to turn off transistors N205 in corresponding tracking cells 230.

Four tracking word line signals WLTRK[3:0] are used for illustration. A different number of tracking word line signals is within the scope of various embodiments. In some embodiments, at least one tracking word line signal, such as tracking word line signal WLTRK[0], is used. The number of tracking word line signals being used depends on the desired speed for tracking bit line signal TRKBL to be pulled down or to fall to a low logical value. For example, when a tracking word line signal WLTRK is activated, corresponding transistors N205 in tracking cells 230 controlled by the activated tracking word line signal WLTRK are turned on to pull tracking bit line signal TRKBL to a low logical value. As additional tracking word line signals WLTRK are activated, additional corresponding transistors N205 are turned on to pull down tracking bit line signal TRKBL. As a result, tracking bit line signal TRKBL is pulled down faster. In contrast, when a lesser number of tracking word line signals WLTRK is activated, a lesser number of transistors N205 is turned on, and tracking bit line signal TRKBL is pulled down slower. Tracking column 120 and circuit 100 are considered a parallel tracking mechanism because tracking word line signals WLTRK[3:0] are configured in almost like a parallel manner, and a tracking word line signal can be removed from or added to tracking column as appropriate.

Various embodiments of the present disclosure are advantageous because additional tracking word line signals, such as tracking word line signals WLTRK[3:1] together with tracking word line WLTRK[0], add further pull down capabilities for tracking bit line signal TRKBL. In contrast, in some existing approaches, only one tracking word line signal, such as one tracking word line signal corresponding to tracking word line signal WLTRK[0], is used. In some existing approaches, additional tracking word line signals, such as tracking word line signals corresponding to tracking word line signals WLTRK[3:1] do not cause corresponding tracking bit line TRKBL to fall faster.

Programmable logic delay 130 includes a logic delay option 210, PMOS transistors P1, P2, P3, and P4, NMOS transistors N1, N2, and N3, and an inverter 220.

Inverter 220 inverts signal RSTB to generate signal RST. By operation of inverter 220, signal RSTB and signal RST are a logical inverse of one another. For example, when signal RSTB is logically high, signal RST is logically low. But when signal RSTB is logically low, signal RST is logically high.

PMOS transistor P4 is used to reset signal RST. For example, when tracking word line signal WLTRK[0] is logically low, PMOS transistor P4 is turned on. As a result, signal RSTB at the drain of transistor P4 is pulled to voltage VDD or a high logical value at the source of transistor P4. By operation of inverter 220, signal RST is logically low. Effectively, signal RST is reset to a low logical value.

Logic delay option 210 receives clock signal SCK, and generates signals G2 and G3 at gates of NMOS transistors N2 and N3, respectively. In some embodiments, one of signals G2 and G3 has a high logical value, and the other signal is clock signal SCK delayed by a time delay generated by logic delay option 210. For illustration, signal G3 has a high logical value while signal G2 is clock signal SCK delayed by the time delay from clock signal CLK. As a result, when circuit 140 is in operation, NMOS transistor N3 having a high logical value at the gate is always on. When signal SCK rises to a high logical value, NMOS transistor N1 is turned on. After a time delay through logic delay option 210, signal G2 at the gate of transistor N2 rises, and transistor N2 is turned on. As a result, three transistors N1, N2, and N3 are turned on. At that time, in some embodiments, at least one tracking cell 230 in tracking column 120 is activated and pulls tracking bit line signal TRKBL to a low logical value. When tracking bit line signal TRKBL is logically low and transistors N1, N2, and N3 are turned on, tracking bit line signal TRKBL pulls signal RSTB to a logical low value of tracking bit line signal TRKBL. Signal RST is therefore logically high. In other words, a rising edge of signal RST is generated based on a falling edge of tracking bit line signal TRKBL.

Logic delay option 210 is used to delay a rising edge of signal RST from a rising edge of clock signal SCK. For example, when clock signal SCK rises, logic delay option 210 provides a time delay for signal G2 to rise. As a result, NMOS transistor N2 is delayed in being turned on, signal RSTB is delayed in being pulled to a low logical value, and signal RST is delayed in rising to a high logical value. Consequently, a larger delay value provided by logic delay option 210 results in a larger time delay before signal RST rises. In contrast, a smaller delay value provided by logic delay option 210 results in a smaller time delay before signal RST rises.

A gate of PMOS transistor P1 is coupled with a gate of NMOS transistor N1, and receives clock signal SCK. As a result, when clock signal SCK is logically low, PMOS transistor P1 is turned on while NMOS transistor N1 is turned off. But when clock signal SCK is logically high, PMOS transistor P1 is turned off while NMOS transistor N1 is turned on.

A gate of PMOS transistor P2 is coupled with a gate of NMOS transistor N2, and receives signal G2. As a result, when signal G2 is logically low, PMOS transistor P2 is turned on while NMOS transistor N2 is turned off. But when signal G2 is logically high, PMOS transistor P2 is turned off while NMOS transistor N2 is turned on.

Similarly, a gate of PMOS transistor P3 is coupled with a gate of NMOS transistor N3, and receives signal G3. As a result, when signal G3 is logically low, PMOS transistor P3 is turned on while NMOS transistor N3 is turned off. But when signal G3 is logically high, PMOS transistor P3 is turned off while NMOS transistor N3 is turned on.

PMOS transistors P1, P2, and P3 and NMOS transistors N1, N2, and N3 form a NAND gate function in which clock signal SCK, signal G2, and signal G3 at gates of transistor N1, N2, and N3 are inputs, and signal RSTB is an output of the NAND gate. As a result, when clock signal SCK, signal G2, and signal G3 are all logically high, output signal RSTB is logically low. For example, after at least one tracking cell 230 in tracking column 120 is activated to pull tracking bit line signal TRKBL to a low logical value when transistors N1, N2, and N3 are turned on, tracking bit line signal TRKBL causes signal RSTB at a drain of transistor N1 to have a logical low value of signal TRKBL at a source of transistor N3. As a result, signal RST is logically high by operation of inverter 220. In contrast, if one of clock signal SCK, signal G2, or signal G3 is logically low, signal RSTB is logically high. For illustration, signal SCK is logically low. As a result, NMOS transistor N1 is turned off, transistors N1, N2, and N3 act as an open circuit and have no electrical effect on signal RSTB at the drain of transistor N1. At the same time, PMOS transistor P1 is turned on and pulls signal RSTB at a drain of transistor P1 to voltage VDD or a high logical value at a source of transistor P1. Operations of the pair of NMOS transistor N2 and PMOS transistor P2 or the pair of NMOS transistor N3 and PMOS transistor P3 are similar to operations of the pair of NMOS transistor N1 and PMOS transistor P1.

Effectively, when three transistors N1, N2, and N3 are all turned on, signal RSTB is logically low and signal RST is logically high. But when at least one of transistors N1, N2, and N3 is turned off, signal RSTB is logically high, and signal RST is logically low.

Three PMOS transistors P1, P2, and P3 and three NMOS transistors N1, N2, and N3 are used as a NAND gate for illustration. A number different from three is within the scope of various embodiments. For example, two PMOS transistors and two NMOS transistors may be used. For another example, four PMOS transistors and four NMOS transistors may be used. In some embodiments, the more number of transistors being used to perform the NAND gate function, the faster signal RSTB is pulled to a corresponding high or low logical value.

In some embodiments, when all tracking write word line signals WLTRK[3:0] are logically low, the memory cells that use tracking write word line signals WLTRK[3:0] are not in an access mode for reading or writing.

In some embodiments, transistors in programmable logic delay 130 and transistor P5 in tracking column 120 are manufactured by a logic process and are called logic transistors. In contrast, other transistors in tracking column 120 are manufactured by a memory process and are called memory transistors.

Circuit 140, Some Further Embodiments

Figure 3:
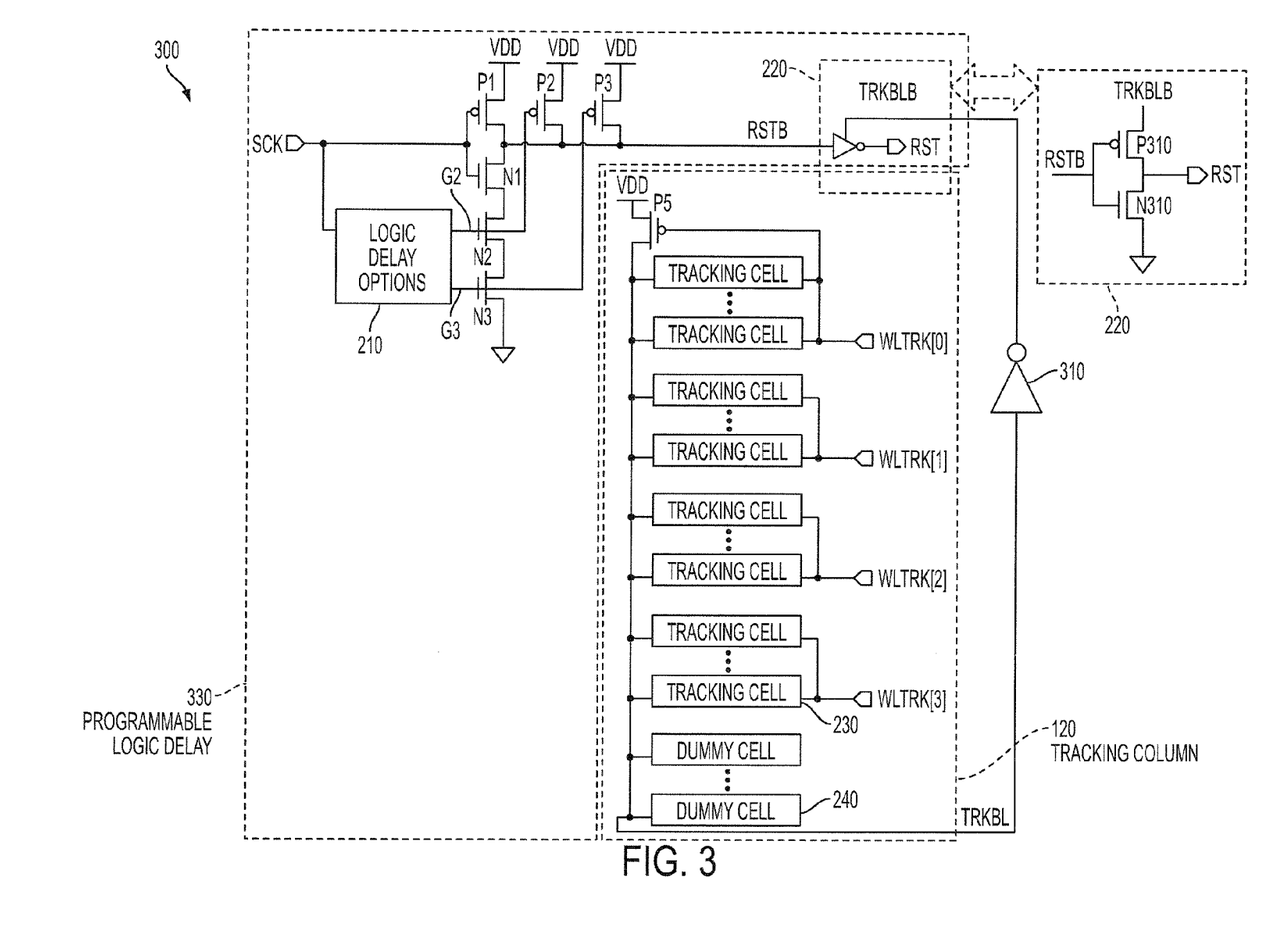
FIG. 3 is a diagram of the sub circuit of the circuit in FIG. 1, in accordance with some further embodiments.

FIG. 3 is a diagram of a circuit 300, in accordance with some embodiments. Circuit 300 is another embodiment of circuit 140 in FIG. 1.

Compared with circuit 200, programmable logic delay 330 corresponds to and is different from programmable logic delay 130 in FIG. 2. For example, the source of NMOS transistor N3 receives a ground reference instead of receiving tracking bit line signal TRKBL of tracking column 120. Programmable logic delay 330 does not include PMOS transistor P4 in programmable logic delay 130. Inverter 220 is controlled by a signal TRKBLB, which is a logical inverse of tracking bit line signal TRKBL. For example, inverter 220 includes a PMOS transistor P310 coupled in series with an NMOS transistor N310 to perform the inverting function. A source of PMOS transistor 310 receives signal TRKBLB. As a result, when tracking bit line signal TRKBL is logically low, signal TRKBLB is logically high, and inverter 220 is activated. But when tracking bit line signal TRKBL is logically high, signal TRKBLB is logically low, and PMOS transistor P310 functions as an open circuit. If, at that time, signal RSTB is logically high, transistor N310 is turned on, and signal RST is pulled to a low logical value at the source of transistor N310.

Also compared with circuit 200, tracking word line signal WLTRK[0] and tracking bit line signal TRKBL of tracking column 120 are used differently. For example, tracking word line signal WLTRK[0] is not used to directly control signal RSTB because programmable logic delay 330 does not include PMOS transistor P4. Further, an inverter 310 inverts tracking bit line signal TRKBL to generate signal TRKBLB, which is used to control inverter 220 of programmable logic delay 330.

Inverter 310 being shown outside programmable logic delay 330 and tracking column 120 is for illustration. Inverter 310 could be part of programmable logic delay 330 or of tracking column 120. Various embodiments of the disclosure are not limited by a location of inverter 310.

Circuit 300 generates signal RST similar to circuit 200 generating signal RST. For example, circuit 330 generates signal RSTB having a low logical value in a manner similar to the generation of signal RSTB having a low logical value by circuit 130 in FIG. 2. For another example, when clock signal SCK rises, NMOS transistors N1, N2, and N3 are all turned on after some time delay generated by logic delay option 210, signal RSTB at the drain of NMOS transistor N1 is pulled to a low logical value at the source of transistor N3. At the same time, at least one of tracking word line signal WLTRK[3:0] is activated to pull tracking bit line signal TRKBL to a low logical value. As a result, tracking bit line signal TRKBLB is logically high, and inverter 220 is activated to invert a low logical value of signal RSTB to generate signal RST having a high logical value. Further, when clock signal SCK is logically low, tracking word line signals WLTRK[3:0] are logically low, and tracking bit line signal TRKBL is logically high. Signal TRKBLB is therefore logically low and deactivates inverter 220. At the same time, signal RSTB is pulled to a source of at least one of transistors P1, P2, or P3. Transistor N310 is therefore turned on to pull signal RST to a low logical value at the source of transistor N310.

In some embodiments, transistors in programmable logic delay 330 are logic transistors.

Read Application of Tracking Column 120

Figure 4:
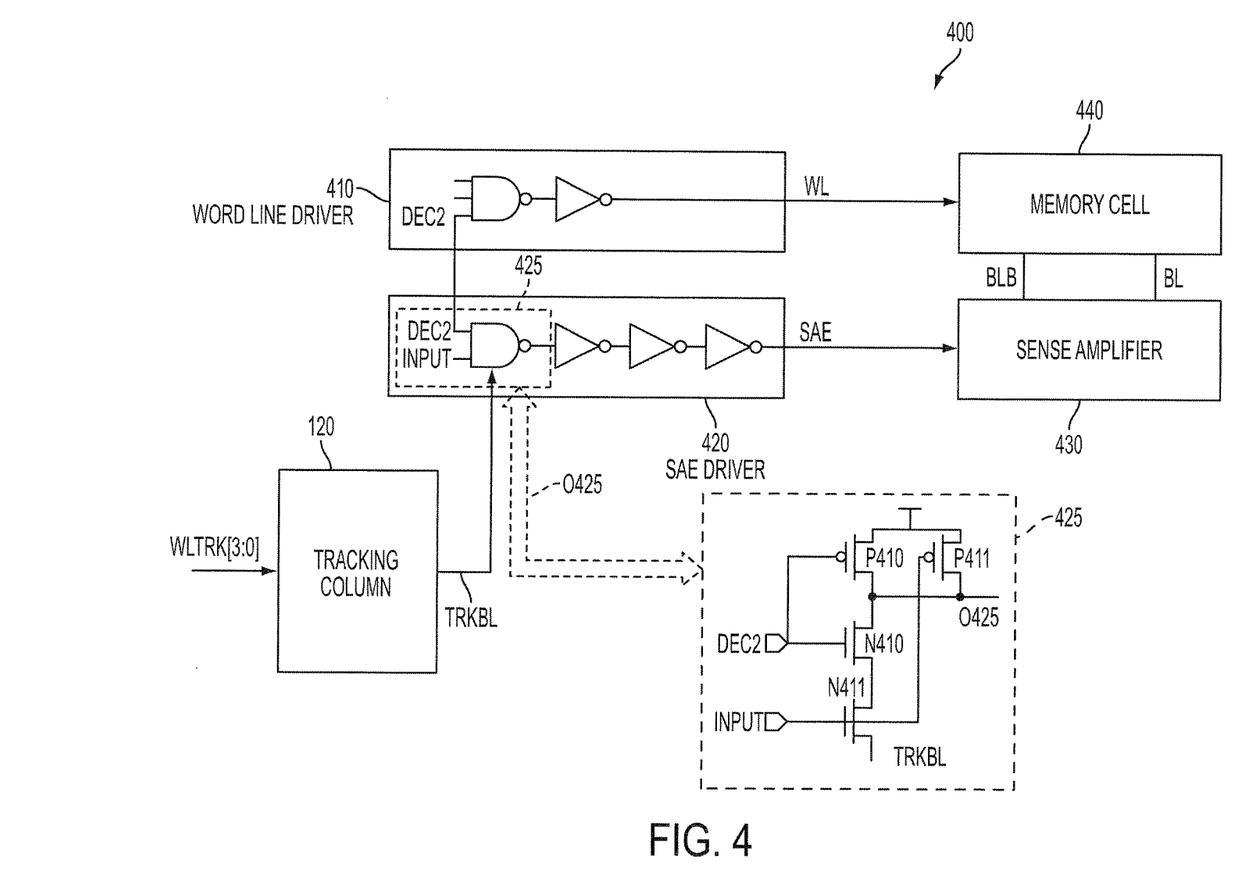
FIG. 4 is a diagram of a circuit used to illustrate an application of the tracking column in FIG. 1 in a read operation, in accordance with some embodiments.

FIG. 4 is a diagram of a circuit 400, in accordance with some embodiments. Circuit 120 is used to illustrate an application of tracking column 120 in a read operation of a memory cell 440.

A word line driver 410 includes a NAND gate and an inverter (not labeled). A sense amplifier enable (SAE) driver 420 includes a NAND gate 425 and three inverters (not labeled). Each NAND gate and each inverter in word line driver 410 and in SAE driver 420 has a time delay. For illustration, each of a NAND gate or an inverter is called a gate and has a same time delay. As a result, a time delay through each NAND gate is equal to a time delay through each inverter, and is called a gate delay.

Word line driver 410 generates a word line signal WL. In some embodiments, a rising edge of word line signal WL is generated with a time delay of two gate delays from a rising edge of signal DEC2. Two gate delays in word line driver 410 are used as an example, a different number of gate delays are within the scope of various embodiments. In some embodiments, before writing to a memory cell 440, bit lines BL and BLB are pre-charged to a high logical value. Further, when word line signal WL is activated to have a high logical value, memory cell 440 is coupled with one of bit lines BL and BLB. For illustration, memory cell 440 is coupled with bit line BL. For further illustration, memory cell 440 stores a low logical value. When memory cell 440 is coupled with bit line BL, bit line BLB remains at a high logical value, and bit line BL is discharged toward a low logical value. A voltage difference between bit line BL and bit line BLB is called a bit line split and starts to develop. When the bit line split is sufficient for a sense amplifier 430 to differentiate the voltage difference between bit line BL and bit line BLB, sense amplifier 430 is turned on to sense the bit line split. Effectively, sense amplifier 430 senses or reads the data stored from memory cell 440 that is represented by the bit line split.

A sense amplifier enable (SAE) driver 420 generates a signal SAE to enable sense amplifier 430 to read the data from memory cell 440 that is represented by the bit line split of bit lines BL and BLB. In some embodiments, a rising edge of signal SAE is generated with a time delay of four gate delays from a rising edge of signal DEC2. Four gate delays in SAE driver 420 are used as an example. A different number of gate delays is within the scope of various embodiments. When signal SAE is activated, sense amplifier 430 is activated to sense the data represented by bit lines BL and BLB.

Tracking column 120 provides tracking bit line signal TRKBL to control NAND gate 425 to control a time delay of signal SAE, which will be explained in details with reference to FIG. 5. NAND gate 425 includes PMOS transistors P410 and P411 and NMOS transistors N410 and N411 that perform the NAND function. A source of NMOS transistor N411 receives tracking bit line signal TRKBL. For illustration, signals DEC and INPUT are logically high to turn on NMOS transistors N410 and N411. As a result, when tracking bit line signal TRKBL is logically low, signal O425 at an output of NAND gate 425 is pulled to the low logical value of tracking bit line signal TRKBL. Signal SAE is inverted from signal O425 by three inverters of SAE driver 420 and is therefore logically high. In other words, NAND gate 425 provides signal SAE having a high logical value in response to tracking bit line signal TRKBL being pulled to a low logical value.

In some embodiments, transistors in word line driver 410, SAE driver 420, and sense amplifier 430 are logic transistors while transistors in memory cell 440 are memory transistors.

Waveforms Illustrating Operations of Circuit 400

Figure 5:
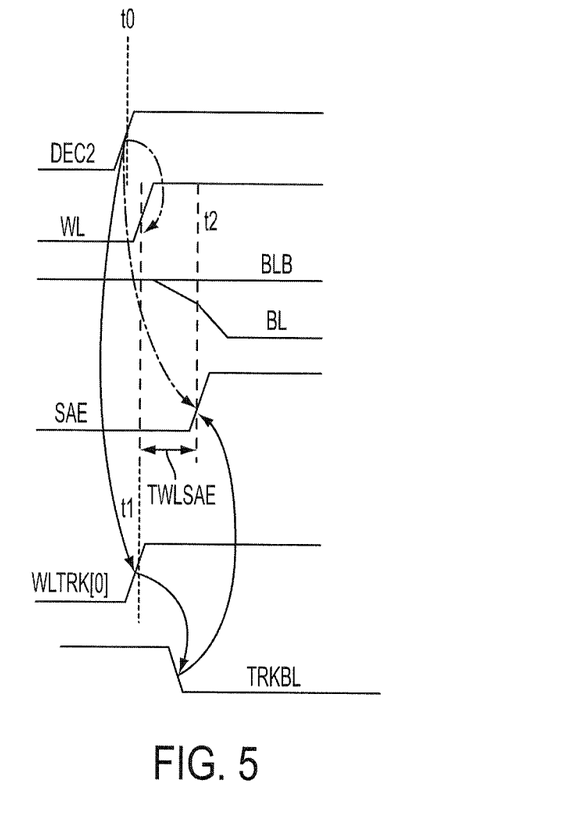
FIG. 5 is a graph of waveforms used to illustrate an operation of the circuit in FIG. 4, in accordance with some embodiments.

FIG. 5 is a graph of waveforms used to illustrate operations of circuit 400, in accordance with some embodiments.

In this illustration, tracking word line signal WLTRK[0] is used to cause tracking bit line TRKBL to fall to a low logical value. Operations of other tracking word line signals WLTRK are similar. In this illustration, signal INPUT is logically high to turn on NMOS transistor N411.

At a time t0, signal DEC2 rises, which causes work line signal WL and signal WLTRK[0] to rise at a time t1 after two gate delays from time t0. The rising edge of signal DEC2 also causes signal SAE to rise at a time t2 after four gate delays from time t0.

For illustration, the time difference between time t1 and time t2 is called time TWLSAE. In some embodiments, time TWLSAE is designed to be large enough so that read signals have sufficient margins for the data stored in memory cell 440 to be successfully read. For example, if time TWLSAE is short, after word line signal WL is activated, the data from memory cell 440 has not appeared on bit lines BL and BLB. In other words, a bit line split between bit lines BL and BLB has not been not sufficiently large for sense amplifier 430 to sense the bit line split. Consequently, reading data from memory cell 440 by sense amplifier 430 results in inaccurate reading.

In some embodiments, a predetermined time TWLSAE is calculated based on simulation considering various factors such as manufacturing process, operational voltage, and temperature variations. The time delay in word line driver 410 and in SAE driver 420 is determined to approximately provide the desired time TWLSAE. In some embodiment, the time delay in each word line driver 410 and in SAE driver 420 is determine based on the number of gates in word line driver 410 and in SAE driver 420. In such a situation, the number of gates in word line driver 410 and in SAE driver 420 is determined to approximately provide the determined time TWLSAE. Tracking bit line signal TRKBL is then controlled so that, together with the number of gates in word line driver 410 and in SAE driver 420, the desired time TWLSAE is achieved. For example, when tracking bit line signal TRKBL is delayed in being pulled to a low logical value, then, through NAND gate 425, signal SAE is delayed from rising. As a result, time TWLSAE is larger. But if tracking bit line TRKBL signal is pulled to a low logical value at an earlier time, signal SAE rises at an earlier time, and time TWLSAE is smaller.

In some embodiments, the time delay caused to tracking bit line signal TRKBL is from the number of tracking word line signals WLTRK[3:0] in FIG. 4. For example, if only one tracking word line signal WLTRK is activated, tracking bit line signal TRKBL falls to a low logical value slowly. But if additional tracking word line signals WLTRK are activated, tracking bit line signal TRKBL falls faster. In some embodiments, after the desired time TWLSAE is determined, the delay in word line driver 410 and in SAE driver 420 is determined. The number of tracking word line WLTRK is then determined to provide the desired time TWLSAE.

Exemplary Method

Figure 6:
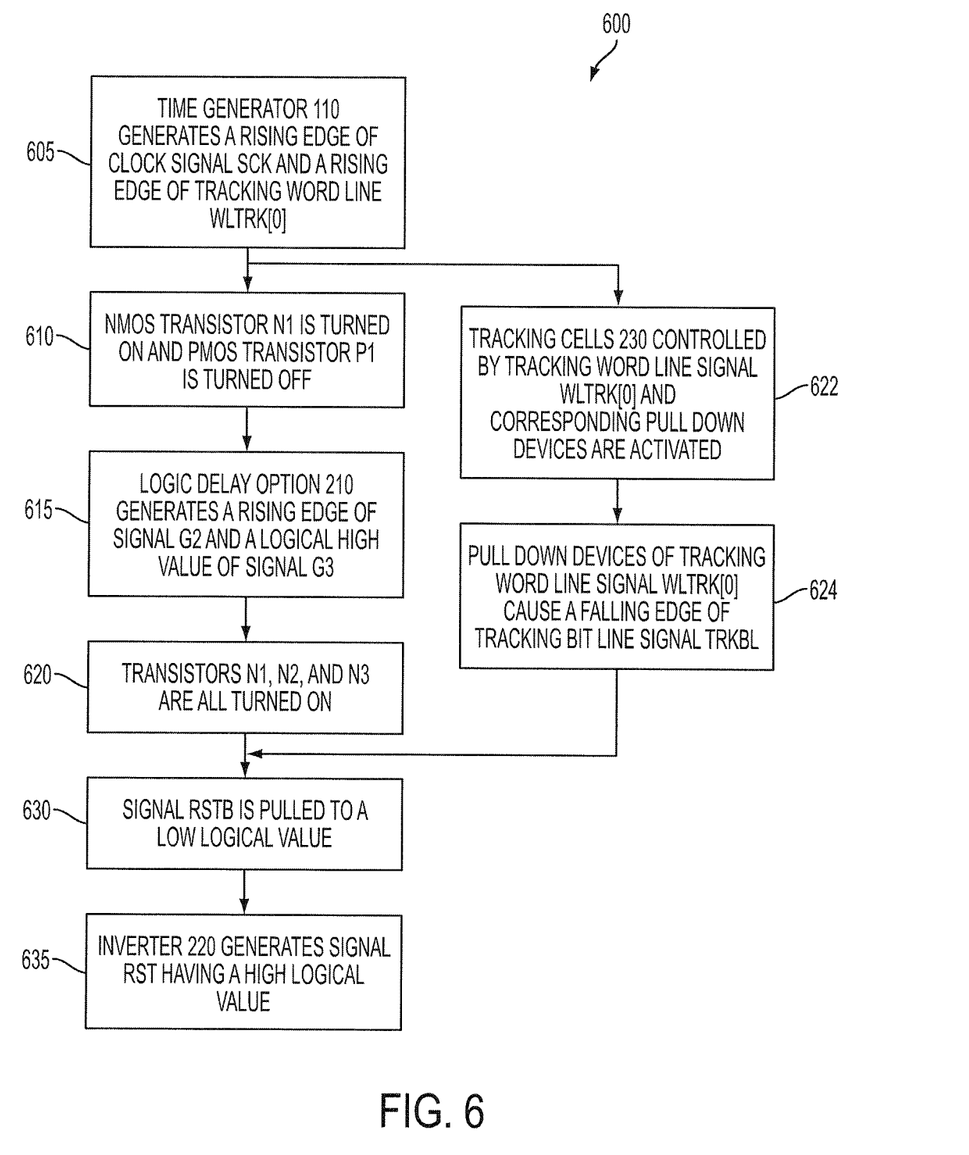
FIG. 6 is a flowchart of a method of operating the circuit in FIG. 1, in accordance with some embodiments.

FIG. 6 is a flowchart of a method 600 of operating circuit 100 in FIG. 1, in accordance with some embodiments. In this illustration, circuit 200 in FIG. 2 is used as circuit 140 in FIG. 1, and a rising edge of signal RST is generated.

In operation 605, time generator 110 generates a rising edge of clock signal SCK based on a rising edge of clock signal CLK. Time generator 110 also generates a rising edge of at least one of tracking word line signals WLTRK[3:0]. For illustration, a rising edge of tracking word line signal WLTRK[0] is generated. Effectively, clock signal SCK and tracking word line signal WLTRK[0] rise to a high logical value. Operations of circuit 100 are similar when other tracking word line signals or when more than one tracking word line signals are generated.

In operation 610, NMOS transistor N1 in FIG. 2 is turned on and PMOS transistor P1 is turned off based on the logical high value of clock signal SCK.

In operation 615, logic delay option 210 generates a rising edge of signal G2 being delayed from the rising edge of clock signal SCK. Effectively, signal G2 has a high logical value after a time delay from clock signal SCK. Logic delay option 210 also generates signal G3 having a high logical value.

In operation 620, transistors N2 and N3 are turned on based on the high logical values of signals G2 and G3, respectively. Effectively, three transistors N1, N2, and N3 are all turned on.

In operation 622, after the rising edge of tracking word line signal WLTRK[0] is turned on in operation 605, tracking cells 230 controlled by tracking word line signal WLTRK[0] and corresponding transistors N205 are activated.

In operation 624, transistors N205 in tracking cells 230 controlled by tracking word line signal WLTRK[0] cause a falling edge of tracking bit line signal TRKBL. As a result, tracking bit line signal TRKBL falls to a low logical value.

In operation 630, after transistors N1, N2, and N3 are turned on in operation 620 and a falling edge of tracking bit line signal TRKBL results in operation 624, signal RSTB is pulled a low logical value of tracking bit line signal TRKBL at the source of NMOS transistor N3.

In operation 635, inverter 220 inverts the low logical value of signal RSTB to generate signal RST having a high logical value. In other words, a rising edge of signal RST is generated.

In the above illustration of FIG. 6, circuit 200 in FIG. 2 is implemented as circuit 140 in FIG. 1. Circuit 100 provides signal RST in a similar manner when circuit 300 in FIG. 3 is implemented as circuit 140. For example, in operation 630, after transistors N1, N2, and N3 are all turned on in operation 620, signal RSTB at the drain of transistor N1 is pulled to ground or a low logical value at the source of transistor N3. In operation 625, after tracking bit line signal TRKBL is logically low, signal TRKBLB is logically high. Inverter 220 is therefore activated and generates signal RST having a high logical value based on a low logical value of signal RSTB in operation 630.

In some embodiments, a predetermined time delay to generate the rising edge of signal RST from the rising edge of clock signal SCK is calculated and provided to logic delay option 210. Stated differently, signal RST is generated based on clock signal SCK. Further, signal RST is also generated from clock signal CLK because clock signal SCK is generated from clock signal CLK. In some embodiments, the predetermined time delay of signal RST from clock signal SCK and/or clock signal CLK is determined by simulation to simulate a worst case condition of a write operation. For example, in a write operation, after a rising edge of a word line signal for a memory cell to be written is generated, a pulse width for the word line signal is determined for a worst case condition for writing to the memory cell. In other words, a falling edge of the word line signal is determined. Further, a rising edge of signal RST is used to cause the falling edge of the write word line of the memory cell to be written. A delay to generate the rising edge of signal RST from the rising edge of clock signal CLK is determined.

Effectively, the delay to generate the pulse width or to cause the falling edge of the word line signal is determined. Such a delay is provided to logic option 210 accordingly.

One aspect of this description relates to a signal generating circuit. The signal generating circuit includes a first circuit, a tracking circuit, and a delay circuit coupled with the first circuit and the tracking circuit. The first circuit is configured to receive a first clock signal and an output signal from an output of the delay circuit and to generate a second clock signal and at least one first tracking signal. The tracking circuit is configured to receive the at least one first tracking signal and to generate a second tracking signal. The delay circuit is configured to receive the second clock signal and the second tracking signal and to generate the output signal.

Another aspect of this description relates to a signal generating circuit. The signal generating circuit includes a first circuit and a tracking circuit coupled with the first circuit. The first circuit includes a first P-type transistor, a second P-type transistor, a first N-type transistor, a second N-type transistor, and a delay circuit. A first terminal of the first P-type transistor is coupled with a first terminal of the first N-type transistor, and is configured to receive a first clock signal. The delay circuit is configured to receive the first clock signal and to generate a first control signal delayed from the first clock signal. A first terminal of the second P-type transistor is coupled with a first terminal of the second N-type transistor, and is configured to receive the first control signal. A second terminal of the first P-type transistor is coupled with a second terminal of the first N-type transistor. The tracking circuit is configured to receive at least one first tracking signals and, based on the at least one first tracking signals, to generate a second tracking signal for use in controlling the first circuit.

Still another aspect of this description relates to a signal generating circuit. The signal generating circuit includes a first circuit and a tracking circuit coupled with the first circuit. The first circuit comprises a first P-type transistor, a second P-type transistor, a first N-type transistor, a second N-type transistor, a delay circuit and a first inverter. A first terminal of the first P-type transistor is coupled with a first terminal of the first N-type transistor, and is configured to receive a first clock signal. The delay circuit is configured to receive the first clock signal and to generate a first control signal delayed from the first clock signal. A first terminal of the second P-type transistor is coupled with a first terminal of the second N-type transistor, and is configured to receive the first control signal. A second terminal of the first P-type transistor is coupled with a second terminal of the first N-type transistor and is configured as a node. The tracking circuit is configured to receive at least one first tracking signal and, based on the at least one first tracking signal, to generate a second tracking signal configured to control the first inverter.

A number of embodiments have been described. It will nevertheless be understood that various modifications may be made without departing from the spirit and scope of the disclosure. For example, various transistors being shown as a particular dopant type (e.g., N-type or P-type metal oxide semiconductor (NMOS or PMOS)) are for illustration purposes. Embodiments of the disclosure are not limited to a particular type. Selecting different dopant types for a particular transistor is within the scope of various embodiments. A low or high logical value of various signals used in the above description is also for illustration. Various embodiments are not limited to a particular value when a signal is activated and/or deactivated. Selecting different values is within the scope of various embodiments. In various embodiments, a transistor functions as a switch. A switching circuit used in place of a transistor is within the scope of various embodiments.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A signal generating circuit comprising:
a first circuit;
a tracking circuit; and
a delay circuit coupled with the first circuit and the tracking circuit,
wherein
the first circuit is configured to receive a first clock signal and an output signal from an output of the delay circuit and to generate a second clock signal and at least one first tracking signal;
the tracking circuit is configured to receive the at least one first tracking signal and to generate a second tracking signal; and
the delay circuit is configured to receive the second clock signal and the second tracking signal and to generate the output signal.

2. The signal generating circuit of claim 1, wherein the delay circuit is configured to generate the output signal for use in deactivating a write signal of a memory cell.

3. The signal generating circuit of claim 1, wherein the first circuit is configured to generate the second clock signal and the at least one first tracking signal in a similar manner.

4. The signal generating circuit of claim 1, wherein the first circuit is configured to generate a rising edge of the second clock signal based on a rising edge of the first clock signal and to generate a falling edge of the second clock signal based on a falling edge of the output signal; and
the first circuit is configured to generate a rising edge of the at least one first tracking signal based on the rising edge of the first clock signal and to generate a falling edge of the at least one first tracking signal based on the falling edge of the output signal.

5. The signal generating circuit of claim 1, wherein the tracking circuit is configured to generate a falling edge of the second tracking signal based on a rising edge of the at least one first tracking signal and to generate a rising edge of the second tracking signal based on a falling edge of the at least one first tracking signal.

6. The signal generating circuit of claim 1, wherein the delay circuit comprises
a sub delay circuit; and
a NAND functioning circuit;
the sub delay circuit is configured to generate a third clock signal delayed from the second clock signal;
the NAND functioning circuit is configured to receive the second clock signal and the third clock signal and generate an intermediate signal for use in generating the output signal; and
the tracking circuit is configured to receive the at least one first tracking signal and to generate the second tracking signal to control the NAND functioning circuit.

7. The signal generating circuit of claim 6, wherein
the NAND functioning circuit comprises:
   a first P-type transistor coupled in parallel with a second P-type transistor; and
   a first N-type transistor coupled in series with a second N-type transistor that is configured to receive the second tracking signal.

8. The signal generating circuit of claim 1, wherein
the delay circuit comprises:
   a sub delay circuit; and
   a NAND functioning circuit;
the sub delay circuit is configured to generate a third clock signal delayed from the second clock signal;
the NAND functioning circuit is configured to receive the second clock signal and the third clock signal and generate an intermediate signal; and
the tracking circuit is configured to receive the at least one first tracking signal and to generate the second tracking signal to control a circuit for use in generating the output signal based on the intermediate signal.

9. The signal generating circuit of claim 8, wherein
the NAND functioning circuit comprises:
   a first P-type transistor;
   a second P-type transistor;
   a first N-type transistor; and
   a second N-type transistor;
a first terminal of the first P-type transistor is coupled with a first terminal of the first N-type transistor, and is configured to receive the second clock signal;
a first terminal of the second P-type transistor is coupled with a first terminal of the second N-type transistor, and is configured to receive the third clock signal; and
a second terminal of the first P-type transistor is coupled with a second terminal of the first N-type transistor and is configured as a node.

10. The signal generating circuit of claim 1, wherein
the tracking circuit comprises:
   at least one group of tracking cells; and
   at least one group of dummy tracking cells coupled with the delay circuit and the at least one group of tracking cells.

11. A signal generating circuit comprising:
a first circuit;
a tracking circuit coupled with the first circuit; and
a delay circuit,
wherein
the delay circuit comprises:
   a first P-type transistor;
   a second P-type transistor;
   a first N-type transistor;
   a second N-type transistor; and
   a sub delay circuit;
a first terminal of the first P-type transistor is coupled with a first terminal of the first N-type transistor, and is configured to receive a first clock signal;
the sub delay circuit is configured to receive the first clock signal and to generate a first control signal delayed from the first clock signal;
a first terminal of the second P-type transistor is coupled with a first terminal of the second N-type transistor, and is configured to receive the first control signal;
a second terminal of the first P-type transistor is coupled with a second terminal of the first N-type transistor and is configured as a node; and
the tracking circuit is configured to receive at least one first tracking signal and, based on the at least one first tracking signal, to generate a second tracking signal for use in controlling a signal on the node.

12. The signal generating circuit of claim 11, wherein
the tracking circuit is configured to generate the second tracking signal to cause a transition of the signal on the node through a third terminal of the first N-type transistor and a third terminal of the second N-type transistor.

13. The signal generating circuit of claim 11, wherein
the tracking circuit is configured to generate the second tracking signal to control a circuit for use in generating an output signal of the signal generating circuit based on the signal on the node.

14. The signal generating circuit of claim 11, wherein
a third terminal of the second N-type transistor is coupled with the tracking circuit, and the third terminal is configured to receive the second tracking signal.

15. The signal generating circuit of claim 11, wherein
the tracking circuit comprises:
   at least one group of tracking cells; and
   at least one group of dummy tracking cells coupled with a third terminal of the second N-type transistor and the at least one group of tracking cells.

16. A signal generating circuit comprising:
a first circuit;
a tracking circuit coupled with the first circuit; and
a delay circuit,
wherein
the delay circuit comprises:
   a first P-type transistor;
   a second P-type transistor;
   a first N-type transistor;
   a second N-type transistor;
   a sub delay circuit; and
   a first inverter;
a first terminal of the first P-type transistor is coupled with a first terminal of the first N-type transistor, and is configured to receive a first clock signal;
the sub delay circuit is configured to receive the first clock signal and to generate a first control signal delayed from the first clock signal;
a first terminal of the second P-type transistor is coupled with a first terminal of the second N-type transistor, and is configured to receive the first control signal;
a second terminal of the first P-type transistor is coupled with a second terminal of the first N-type transistor and is configured as a node; and
the tracking circuit is configured to receive at least one first tracking signal and, based on the at least one first tracking signal, to generate a second tracking signal configured to control the first inverter.

17. The signal generating circuit of claim 16, wherein
the first inverter is configured to be activated based on an inverted second tracking signal, and the first inverter is configured to generate anoutput signal of the signal generating circuit.

18. The signal generating circuit of claim 16, wherein
the first inverter comprises:
   a third P-type transistor; and
   a third N-type transistor;
a first terminal of the third P-type transistor is coupled to a first terminal of the third N-type transistor and the node;
a second terminal of the third P-type transistor is coupled to a second terminal of the third N-type transistor and an output terminal; and a third terminal of the third P-type transistor is coupled to the tracking circuit and is configured to receive an inverted second tracking signal.

19. The signal generating circuit of claim 16, further comprising:
a second inverter configured to receive the second tracking signal and generate an inverted second tracking signal.

20. The signal generating circuit of claim 16, wherein
a third terminal of the second N-type transistor is coupled with a ground terminal, and the third terminal is configured to receive a ground reference.

* * * * *